United States Patent
Hong et al.

(10) Patent No.: US 11,146,426 B2
(45) Date of Patent: Oct. 12, 2021

(54) BALANCING CIRCUIT CAPABLE OF COMPENSATING BANDWIDTH ATTENUATION INTRODUCED BY INTERFERENCE BETWEEN SIGNALS

(71) Applicant: XIAMEN UX HIGH-SPEED IC CO., LTD., Fujian (CN)

(72) Inventors: Ming Hong, Xiamen (CN); Yonghui Lin, Xiamen (CN); Faming Li, Xiamen (CN); Zhiyang Chen, Xiamen (CN)

(73) Assignee: XIAMEN UX HIGH-SPEED IC CO., LTD., Fujian (CN)

( * ) Notice: Subject to any disclaimer, the term of this patent is extended or adjusted under 35 U.S.C. 154(b) by 0 days.

(21) Appl. No.: 16/975,713

(22) PCT Filed: Mar. 7, 2018

(86) PCT No.: PCT/CN2018/078205
§ 371 (c)(1),
(2) Date: Aug. 26, 2020

(87) PCT Pub. No.: WO2019/169568
PCT Pub. Date: Sep. 12, 2019

(65) Prior Publication Data
US 2020/0403830 A1  Dec. 24, 2020

(51) Int. Cl.
*H04L 25/03* (2006.01)
*H03F 1/42* (2006.01)
*H03F 3/193* (2006.01)
*H04L 7/00* (2006.01)
*H03K 19/20* (2006.01)

(52) U.S. Cl.
CPC ......... *H04L 25/03019* (2013.01); *H03F 1/42* (2013.01); *H03F 3/193* (2013.01); *H04L 7/0091* (2013.01); *H03F 2200/36* (2013.01); *H03K 19/20* (2013.01)

(58) Field of Classification Search
CPC ............ H04L 25/03019; H04L 7/0091; H04L 25/03012; H04L 25/03878; H03F 1/42; H03F 3/193; H03F 2200/36; H03F 1/3211; H03F 3/211; H03F 3/45183; H03K 19/20
See application file for complete search history.

(56) References Cited

U.S. PATENT DOCUMENTS

| | | | | |
|---|---|---|---|---|
| 4,899,344 A | * | 2/1990 | Shibata | G06K 15/1214 372/29.012 |
| RE34,769 E | * | 11/1994 | Yoshimoto | G11B 7/094 250/201.5 |
| 5,398,008 A | * | 3/1995 | Nissler | H01S 5/042 332/152 |

(Continued)

*Primary Examiner* — Jean B Corrielus
(74) *Attorney, Agent, or Firm* — Leong C. Lei

(57) ABSTRACT

A balancing circuit which may compensate for bandwidth attenuation introduced by interference between signals includes an amplifying circuit, a rising edge detection circuit and/or a falling edge detection circuit. By means of detecting the rising/falling edge of an original signal, the resulting pulse signal contains the phase information of a single "0" bit and a single "1" bit in the original signal, thus the phase of a rising edge or the phase of a falling edge of the original signal may be compensated respectively, so as to compensate for the high-frequency attenuation caused by interference between signals.

5 Claims, 3 Drawing Sheets

(56) References Cited

U.S. PATENT DOCUMENTS

2007/0229124 A1\* 10/2007 Tokuno ............... H03K 17/122
                                                            327/112
2017/0047099 A1\* 2/2017 Aipperspach .... G11C 29/12005
2019/0097621 A1\* 3/2019 Kim ......................... G06F 1/06

\* cited by examiner

BALANCING CIRCUIT CAPABLE OF COMPENSATING BANDWIDTH ATTENUATION INTRODUCED BY INTERFERENCE BETWEEN SIGNALS

BACKGROUND OF THE INVENTION

1. Field of the Invention

The present invention relates to an electronic circuit, and more particularly to a balancing circuit capable of compensating for bandwidth attenuation introduced by inter-symbol interference.

2. Description of the Prior Art

The jitter of high-speed transmission signals is an important indicator that affects the quality of signal transmission. It is required to use an equalizer for eliminating jitter. Equalizers are common circuits for high-speed digital signal circuits and are widely used in the design of high-speed integrated circuits for optical communications, such as TIA, LA, LDD, etc. Its principle is to use compensation technology to increase signal high-frequency gain, widen signal-3 dB bandwidth, and reduce jitter.

Data Dependent Jitter (DDJ) introduced by inter-symbol interference (ISI) during signal transmission is a kind of jitter. A single "0" bit and a single "1" bit in the bitstream of the data signal contain the largest high frequency components. In the process of data transmission, the loss of the high frequency components of these bits is great, and the distortion of the bits is also great. So far, there is no special equalizer dedicated to compensating ISI jitter.

FIG. 1 shows a compensation circuit of a conventional equalizer. As shown in FIG. 1, INP0 and INN0 are input pins of the equalizer. INP1 and INN1 are the signal input pins after the signal has been "delayed and performed logical negation". OUTP and OUTN are output pins of the equalizer. The original input signal INP0/INN0 is superimposed with the input signal INP1/INN1 after the signal has been "delayed and performed logical negation", which can increase the relative amplitude of the rising/falling edge of the signal bit, and increase the amplitude of the high-frequency component of the signal in the frequency domain, so as to achieve the purpose of increasing the signal bandwidth.

Although the existing technical solution can increase the signal bandwidth effectively, it cannot compensate for the loss of high-frequency components due to ISI (inter-symbol interference). Besides, the existing solution can only compensate for the gain at the rising and falling edges of the signal at the same time. However, in the process of signal transmission, the attenuations of high frequency components of different bits are different. The existing solution cannot compensate for the rising and falling edges of the signal separately.

SUMMARY OF THE INVENTION

The primary object of the present invention is to provide a balancing circuit capable of compensating for bandwidth attenuation introduced by inter-symbol interference, which can compensate for the high-frequency attenuation caused by inter-symbol interference.

In order to achieve the above object, the solutions of the present invention are described below.

A balancing circuit capable of compensating for bandwidth attenuation introduced by inter-symbol interference comprises an amplifying circuit, a rising edge detection circuit and/or a falling edge detection circuit. The amplifying circuit includes a first amplifying circuit, a second amplifying circuit, and a third amplifying circuit. An input terminal of the first amplifying circuit is connected to an input terminal of the balancing circuit. An output terminal of the first amplifying circuit is connected to an output terminal of the balancing circuit. An input terminal of the falling edge detection circuit is connected to the input terminal of the balancing circuit. An output terminal of the falling edge detection circuit is connected to an input terminal of the second amplifying circuit. An output terminal of the second amplifying circuit is connected to the output terminal of the balancing circuit. An input terminal of the rising edge detection circuit is connected to the input terminal of the balancing circuit. An output terminal of the rising edge detection circuit is connected to an input terminal of the third amplifying circuit. An output terminal of the third amplifying circuit is connected to the output terminal of the balancing circuit.

The falling edge detection circuit includes a first time-delay unit, a first NOT gate, a second NOT gate, a first AND gate, a second time-delay unit, and a first path selection switch. The input terminal of the falling edge detection circuit is connected to an input terminal of the first time-delay unit. An output terminal of the first time-delay unit is connected to an input terminal of the first AND gate. The input terminal of the falling edge detection circuit is further connected to an input terminal of the first NOT gate. An output terminal of the first NOT gate is connected to another input terminal of the first AND gate. An output terminal of the first AND gate is connected to an input terminal of the second time-delay unit. An output terminal of the second time-delay unit is connected to an input terminal of the first path selection switch. The output terminal of the second time-delay unit is further connected to another input terminal of the first path selection switch through the second NOT gate. An output terminal of the first path selection switch serves as the output terminal of the falling edge detection circuit and is connected to the input terminal of the second amplifying circuit.

The rising edge detection circuit includes a first time-delay unit, a third NOT gate, a fourth NOT gate, a second AND gate, a third time-delay unit, and a second path selection switch. The input terminal of the rising edge detection circuit is connected to an input terminal of the first time-delay unit. An output terminal of the first time-delay unit is connected to an input terminal of the third NOT gate. An output terminal of the third NOT gate is connected to an input terminal of the second AND gate. The input terminal of the rising edge detection circuit is further connected to another input terminal of the second AND gate. An output terminal of the second AND gate is connected to an input terminal of the third time-delay unit. An output terminal of the third time-delay unit is connected to an input terminal of the second path selection switch. The output terminal of the third time-delay unit is further connected to another input terminal of the second path selection switch via the fourth NOT gate. An output terminal of the second path selection switch serves as the output terminal of the rising edge detection circuit and is connected to the input terminal of the third amplifying circuit.

The amplifying circuit includes an MOS transistor M1, an MOS transistor M2, an MOS transistor M3, an MOS transistor M4, an MOS transistor M5, an MOS transistor M6, a resistor R1, a resistor R2, a variable current source Itail0, a variable current source Itail1, and a variable current source Itail2. The MOS transistor M1, the MOS transistor M2, the resistor R1, the resistor R2 and the variable current source Itail0 constitute the first amplifying circuit. The MOS transistor M3, the MOS transistor M4, the resistor R1, the resistor R2 and the variable current source Itail1 constitute the second amplifier circuit. The MOS transistor M5, the MOS transistor M6, the resistor R1, the resistor R2 and the variable current source Itail2 constitute the third amplifier circuit.

A gate of the MOS transistor M1 is connected to an input terminal inp0 of the first amplifying circuit, a source of the MOS transistor M1 is grounded through the variable current source Itail0, a drain of the MOS transistor M1 is connected to a power supply Vdd through the resistor R1, and the drain of the MOS transistor M1 serves as one output terminal of the first amplifying circuit and is connected to an output terminal outn of the balancing circuit. A gate of the MOS transistor M2 is connected to an input terminal inn0 of the first amplifying circuit, a source of the MOS transistor M2 is grounded through the variable current source Itail0, a drain of the MOS transistor M2 is connected to the power supply Vdd through the resistor R2, and the drain of the MOS transistor M2 serves as another output terminal of the first amplifying circuit and is connected to another output terminal outp of the balancing circuit; A gate of the MOS transistor M3 is connected to an input terminal inp1 of the second amplifying circuit, a source of the MOS transistor M3 is grounded through the variable current Itail1, a drain of the MOS transistor M3 is connected to the power supply Vdd through the resistor R1, and the drain of the MOS transistor M3 serves as one output terminal of the second amplifying circuit and is connected to the output terminal outn of the balancing circuit. A gate of the MOS transistor M4 is connected to an input terminal inn1 of the second amplifying circuit, a source of the MOS transistor M4 is grounded through the variable current source Itail1, a drain of the MOS transistor M4 is connected to the power supply Vdd through the resistor R2, and the drain of the MOS transistor M4 serves as another output terminal of the second amplifier circuit and is connected to the output terminal outp of the balancing circuit.

A gate of the MOS transistor M5 is connected to an input terminal inp2 of the third amplifying circuit, a source of the MOS transistor M5 is grounded through the variable current Itail2, a drain of the MOS transistor M5 is connected to the power supply Vdd through the resistor R1, and the drain of the MOS transistor M5 serves as one output terminal of the third amplifying circuit and is connected to the output terminal outn of the balancing circuit. A gate of the MOS transistor M6 is connected to an input terminal inn2 of the third amplifying circuit, a source of the MOS transistor M6 is grounded through the variable current Itail2, a drain of the MOS transistor M6 is connected to the power supply Vdd through the resistor R2, and the drain of the MOS transistor M6 serves as another output terminal of the third amplifying circuit and is connected to the output terminal outp of the balancing circuit.

The MOS transistor of the amplifying circuit is replaceable with a transistor.

After adopting the above solutions, in the present invention, the phase information of the single "0" bit in the bitstream can be found through the falling edge detection pulse to adjust the phase of the single "0" bit, and the phase information of the single "1" bit in the bitstream can be found through the rising edge detection pulse to adjust the phase of the single "1" bit, so as to realize compensation for the phase of the rising edge of the original signal and the phase of the falling edge of the original signal. Thus, the phase of the single "1" bit or the single "0" bit in the original signal is adjusted, the signal bandwidth is widened, and the high-frequency attenuation caused by inter-symbol interference is compensated.

The falling edge detection pulse of the present invention can find the phase information of the single "0" bit in the bitstream, and the rising edge detection pulse can find the phase information of the single "1" bit in the bitstream. Since the two detection pulse paths are separated, the rising and falling edges of the signal can be adjusted separately.

DETAILED DESCRIPTION OF THE PREFERRED EMBODIMENTS

The present invention discloses a balancing circuit that can compensate for bandwidth attenuation caused by inter-symbol interference. By means of detecting the rising/falling edge of an original signal, the resulting pulse signal contains the phase information of a single "0" bit and a single "1" bit in the original signal. Therefore, the phase of a rising edge or the phase of a falling edge of the original signal can be compensated respectively, so as to compensate for the high-frequency attenuation caused by inter-symbol interference.

Figure 1:
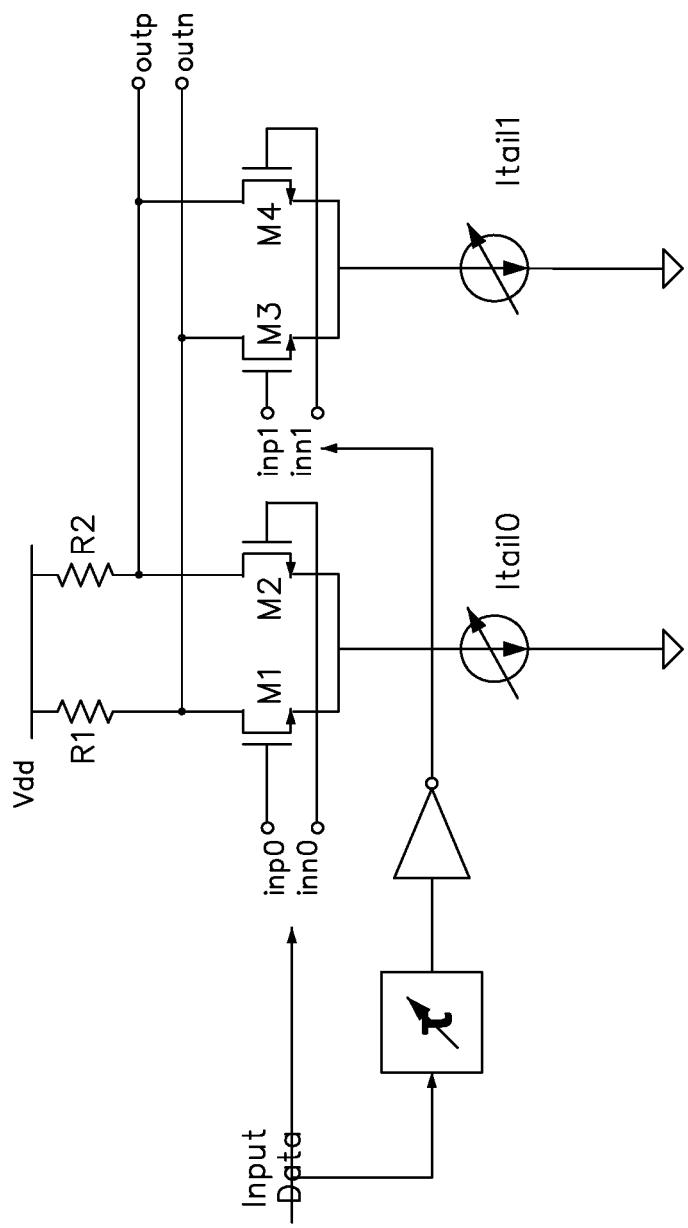
FIG. 1 is circuit diagram of a conventional balancing circuit.
Figure 2:
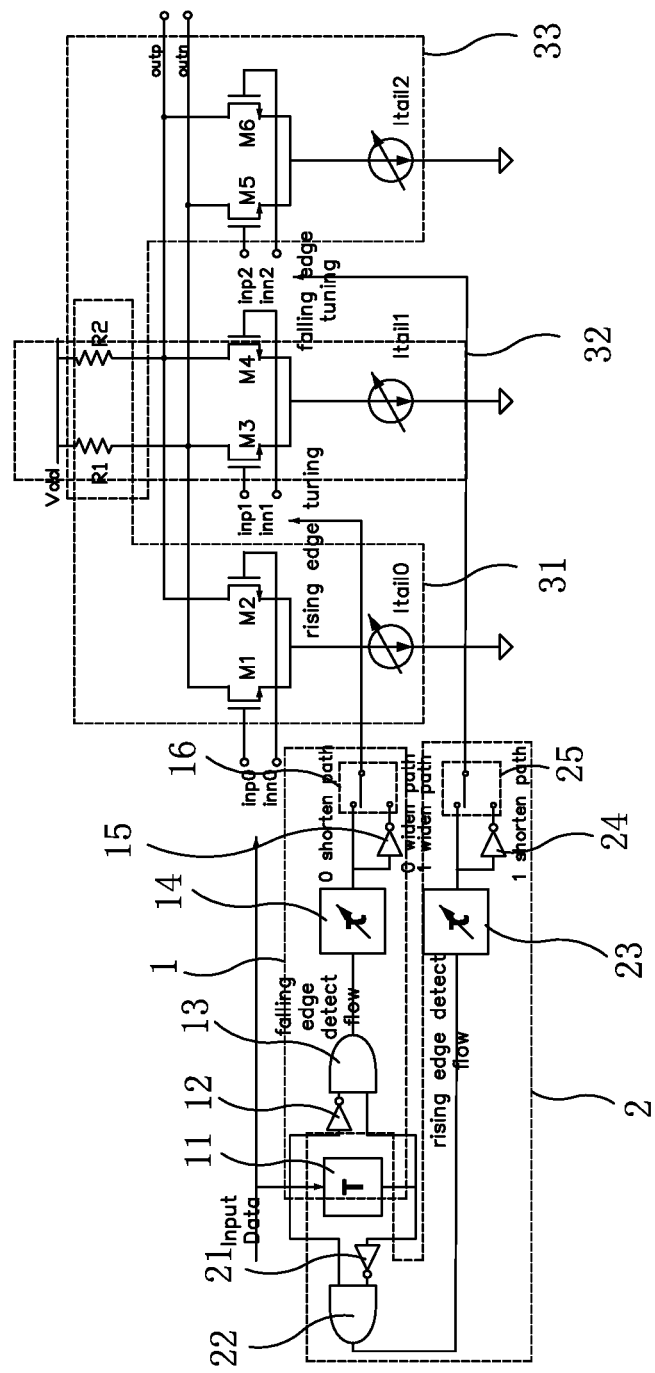
FIG. 2 is circuit diagram of a balancing circuit according to a first embodiment of the present invention.

FIG. 2 is a circuit diagram of a balancing circuit that can compensate for bandwidth attenuation caused by inter-symbol interference. As shown in FIG. 2, the balancing circuit comprises a rising edge detection circuit 2, a falling edge detection circuit 1, and an amplifying circuit. The amplifying circuit includes a first amplifying circuit 31, a second amplifying circuit 32, and a third amplifying circuit 33. An input terminal of the first amplifying circuit 31 is connected to an input terminal of the balancing circuit, and an output terminal of the first amplifying circuit 31 is connected to an output terminal of the balancing circuit. An input terminal of the falling edge detection circuit 1 is connected to the input terminal of the balancing circuit, and an output terminal of the falling edge detection circuit 1 is connected to an input terminal of the second amplifying circuit 32. An output terminal of the second amplifying circuit 32 is connected to the output terminal of the balancing circuit. An input terminal of the rising edge detection circuit 2 is connected to the input terminal of the balancing circuit. An output terminal of the rising edge detection circuit 2 is connected to an input terminal of the third amplifying circuit 33. An output terminal of the third amplifying circuit 33 is connected to the output terminal of the balancing circuit.

Wherein, the first amplifying circuit 31 serves as an original signal path, and the signal output from the output terminal of the first amplifying circuit 31 is the original signal. The second amplifying circuit 32 serves as a compensation signal path for the single "0" bit, and the signal output from the second amplifying circuit 32 is a compensation signal for the single "0" bit. The third amplifying circuit 33 serves as a compensation signal path for the single "1" bit, and the signal output from the third amplifying circuit 33 is a compensation signal for the single "1" bit. The output signals of the three amplifying circuits are superimposed together, which realizes the compensation of the phase of the rising edge or the phase of the falling edge in the original signal, thereby realizing compensation for the high frequency attenuation caused by inter-symbol interference.

The falling edge detection circuit 1 includes a first time-delay unit 11, a first NOT gate 12, a second NOT gate 15, a first AND gate 13, a second time-delay unit 14, and a first path selection switch 16. The input terminal of the falling edge detection circuit 1 is connected to an input terminal of the first time-delay unit 11. An output terminal of the first time-delay unit 11 is connected to an input terminal of the first AND gate 13. The input terminal of the falling edge detection circuit 1 is also connected to an input terminal of the first NOT gate 12. An output terminal of the first NOT gate 12 is connected to another input terminal of the first AND gate 13. An output terminal of the first AND gate 13 is connected to an input terminal of the second time-delay unit 14. On the one hand, an output terminal of the second time-delay unit 14 is connected to an input terminal of the first path selection switch 16, and on the other hand, is connected to another input terminal of the first path selection switch 16 through the second NOT gate 15. An output terminal of the first path selection switch 16 serves as the output terminal of the falling edge detection circuit 1 and is connected to the input terminal of the second amplifying circuit 32. The first time-delay unit 11 is configured to delay the signal for a period of T. The first path selection switch 16 can be implemented by an individual-pole double-throw switch.

When the input signal InputData passes through the falling edge detection circuit 1, an inverted signal of the input signal InputData and a signal of the input signal InputData after a delay of one period of T are taken to perform the logical AND operation to obtain a falling edge detection pulse. The falling edge of the falling edge detection pulse is in phase with the rising edge of the single "0" bit in the bitstream of the original signal, that is, it contains the phase information of the rising edge of the single "0" bit in the bitstream. The falling edge detection pulse or the inverted signal obtained by performing logical negation on the falling edge detection pulse serves as the output signal of the falling edge detection circuit 1 to be transmitted to the input terminal of the second amplifying circuit 32.

Figure 3:
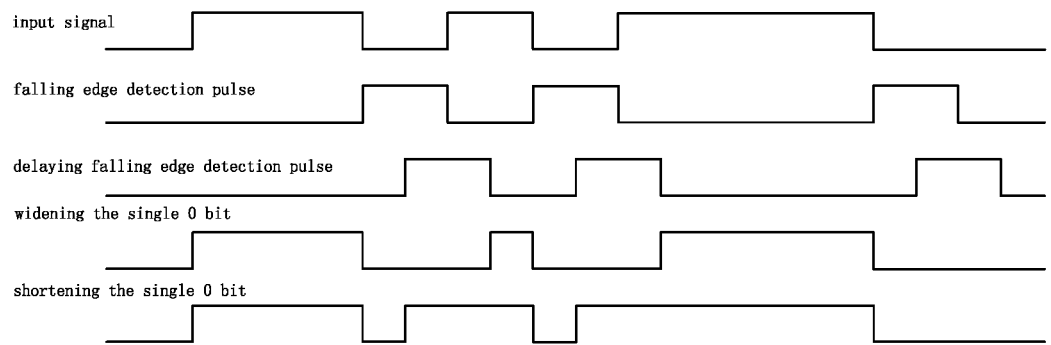
FIG. 3 is a timing diagram of individual compensation for the rising edge of the input signal according to the present invention.

When the output signal of the falling edge detection circuit 1 is the inverted signal of the falling edge pulse, it is input into the second amplifying circuit 32, and the output signal of the second amplifying circuit 32 is superimposed with the output signal of the first amplifying circuit 31, thereby widening and adjusting the phase of the rising edge of the single "0" bit in the original signal. When the output signal of the falling edge detection circuit 1 is the falling edge pulse, it is input to the second amplifying circuit 32, and the output signal of the second amplifying circuit 32 is superimposed with the output signal of the first amplifying circuit 31, thereby shorting and adjusting the phase of the rising edge of the single "0" bit in the original signal. The signal timing diagram of each stage of the above adjustment is shown in FIG. 3.

The rising edge detection circuit 2 includes a first time-delay unit 11, a third NOT gate 21, a fourth NOT gate 24, a second AND gate 22, a third time-delay unit 23, and a second path selection switch 25. The input terminal of the rising edge detection circuit 2 is connected to an input terminal of the first time-delay unit 11. An output terminal of the first time-delay unit 11 is connected to an input terminal of the third NOT gate 21. An output terminal of the third NOT gate 21 is connected to an input terminal of the second AND gate 22, and the input terminal of the rising edge detection circuit 2 is also connected to another input terminal of the second AND gate 22. An output terminal of the second AND gate 22 is connected to an input terminal of the third time-delay unit 23. An output terminal of the third time-delay unit 23 is connected to an input terminal of the second path selection switch 25, and is further connected to another input terminal of the second path selection switch 25 via the fourth NOT gate 24. An output terminal of the second path selection switch 25 serves as the output terminal of the rising edge detection circuit 2 and is connected to the input terminal of the third amplifying circuit 33.

When the input signal InputData passes through the rising edge detection circuit 2, a signal obtained by delaying the input signal InputData one period of T and performing logical negation and the input signal InputData are taken to perform the logical AND operation to obtain a rising edge detection pulse. The falling edge of the rising edge detection pulse is in phase with the falling edge of the single "1" bit in the bitstream of the original signal, that is, it contains the phase information of the falling edge of the single "1" bit in the bitstream. The rising edge detection pulse or the inverted signal of the rising edge detection pulse serves as the output signal of the rising edge detection circuit 2 to be transmitted to the input terminal of the third amplifying circuit 33.

Figure 4:
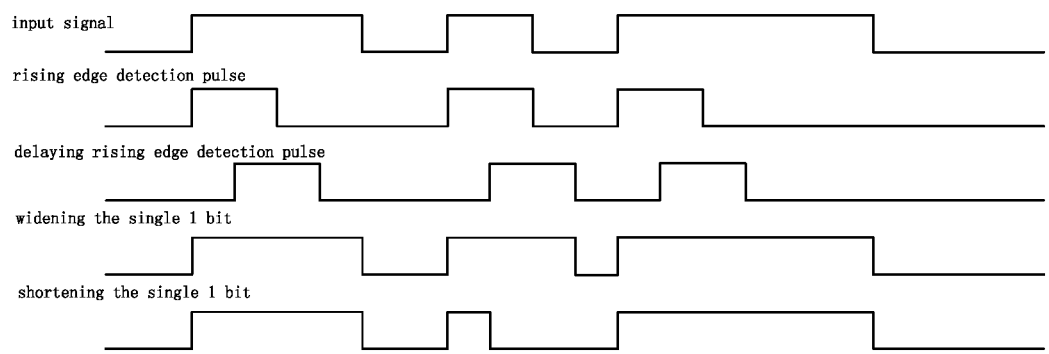
FIG. 4 is a timing diagram of individual compensation for the falling edge of the input signal according to the present invention.

When the output signal of the rising edge detection circuit 2 is the rising edge detection pulse, it is input to the third amplifying circuit 33, and the output signal of the third amplifying circuit 33 is superimposed with the output signal of the first amplifying circuit 31, thereby widening and adjusting the phase of the falling edge of the single "1" bit in the original signal. When the output signal of the rising edge detection circuit 2 is the inverted signal of the rising edge detection pulse, it is input to the third amplifying circuit 33, and the output signal of the third amplifying circuit 33 is superimposed with the output signal of the first amplifying circuit 31, thereby shorting and adjusting the phase of the falling edge of the single "1" bit in the original signal. The signal timing diagram of each stage of the above adjustment is shown in FIG. 4.

The amplifying circuit includes an MOS transistor M1, an MOS transistor M2, an MOS transistor M3, an MOS transistor M4, an MOS transistor M4, an MOS transistor M5, an MOS transistor M6, a resistor R1, a resistor R2, a variable current source Itail0, a variable current source Itail1, and a variable current source Itail2. The MOS transistor M1, the MOS transistor M2, the resistor R1, the resistor R2, and the variable current source Itail0 constitute the first amplifying circuit 31. The MOS transistor M3, the MOS transistor M4, the resistor R1, the resistor R2, and the variable current source Itail1 constitute the second amplifier circuit 32. The MOS transistor M5, the MOS transistor M6, the resistor R1, the resistor R2, and the variable current source Itail2 constitute the third amplifier circuit 33.

In the first amplifying circuit 31, a gate of the MOS transistor M1 is connected to the input terminal inp0 of the first amplifying circuit 31, a source of the MOS transistor M1 is grounded through the variable current source Itail0, a drain of the MOS transistor M1 is connected to a power supply Vdd through the resistor R1, and the drain of the MOS transistor M1 serves as one output terminal of the first amplifying circuit 31 and is connected to the output terminal outn of the balancing circuit. A gate of the MOS transistor M2 is connected to the input terminal inn0 of the first amplifying circuit 31, a source of the MOS transistor M2 is grounded through the variable current source Itail0, a drain of the MOS transistor M2 is connected to the power supply Vdd through the resistor R2, and the drain of the MOS transistor M2 serves as another output terminal of the first amplifying circuit 31 and is connected to the output terminal outp of the balancing circuit.

In the second amplifying circuit 32, a gate of the MOS transistor M3 is connected to the input terminal inp1 of the second amplifying circuit 32, a source of the MOS transistor M3 is grounded through the variable current Itail1, a drain of the MOS transistor M3 is connected to the power supply Vdd through the resistor R1, and the drain of the MOS transistor M3 serves as one output terminal of the second amplifying circuit 32 and is connected to the output terminal outn of the balancing circuit. A gate of the MOS transistor M4 is connected to the input terminal inn1 of the second amplifying circuit 32, a source of the MOS transistor M4 is grounded through the variable current source Itail1, a drain of the MOS transistor M4 is connected to the power supply Vdd through the resistor R2, and the drain of the MOS transistor M4 serves as another output terminal of the second amplifier circuit 32 and is connected to the output terminal outp of the balancing circuit.

In the third amplifying circuit 33, a gate of the MOS transistor M5 is connected to the input terminal inp2 of the third amplifying circuit 33, a source of the MOS transistor M5 is grounded through the variable current Itail2, a drain of the MOS transistor M5 is connected to the power supply Vdd through the resistor R1, and the drain of the MOS transistor M5 serves as one output terminal of the third amplifying circuit 33 and is connected to the output terminal outn of the balancing circuit. A gate of the MOS transistor M6 is connected to the input terminal inn2 of the third amplifying circuit 33, a source of the MOS transistor M6 is grounded through the variable current Itail2, a drain of the MOS transistor M6 is connected to the power supply Vdd through the resistor R2, and the drain of the MOS transistor M6 serves as another output terminal of the third amplifying circuit 33 and is connected to the output terminal outp of the balancing circuit.

The MOS transistor of the above amplifying circuit may be replaced with a transistor. When a transistor is used instead, the emitter of the transistor corresponds to the source of the MOS transistor, the base of the transistor corresponds to the gate of the MOS transistor, and the collector of the transistor corresponds to the drain of the MOS transistor.

By adjusting the three variable current sources of the amplifying circuit respectively, the amplification ratio of the corresponding amplifying circuit can be adjusted, and the output signal of the balancing circuit can be adjusted together.

The single "0" bit and the single "1" bit in the bitstream of the data signal contain the largest high frequency components. Therefore, in the process of data transmission, the loss of the high frequency components of these bits is great, which causes the most serious distortion of the single "0" bit and the single "1" bit. (This is also the definition of inter-symbol interference).

In the present invention, the phase information of the single "0" bit in the bitstream can be found through the falling edge detection pulse, and the phase information of the single "1" bit in the bitstream can be found through the rising edge detection pulse. Then, the phase of the single "0" bit and the phase of the single "1" bit are adjusted, so that the phase of the single "0" bit or the single "1" bit in the original signal is adjusted (widened or shortened), so as to compensate for the high-frequency loss of the bits, widen the signal bandwidth, and realize compensation for the high-frequency attenuation caused by inter-symbol interference.

The falling edge detection pulse of the present invention can find the phase information of the single "0" bit in the bitstream, and the rising edge detection pulse can find the phase information of the single "1" bit in the bitstream. Since the two detection pulse paths are separated, the rising and falling edges of the signal can be adjusted separately.

The balancing circuit shown in FIG. 2 is only a preferred embodiment of the present invention. In practical applications, the balancing circuit may be composed of the rising edge detection circuit 2 and the amplifying circuit. In this case, the amplifying circuit includes the first amplifying circuit 31 and the third amplifying circuit 33. Alternatively, the balancing circuit is composed of the falling edge detection circuit 1 and the amplifying circuit. In this case, the amplifying circuit includes the first amplifying circuit 31 and the second amplifying circuit 32. In these two cases, the balancing circuit only adjusts the phase of the single "1" bit or only adjusts the phase of the single "0" bit to realize the falling edge compensation or the rising edge compensation of the original signal. The high-frequency attenuation caused by inter-symbol interference can also be compensated to a certain extent, but the compensation effect is worse than that of the embodiment shown in FIG. 2.

What is claimed is:

1. A balancing circuit comprising:
   an amplifying circuit;
   a rising edge detection circuit; and
   a falling edge detection circuit;
   wherein the amplifying circuit includes a first amplifying circuit, a second amplifying circuit, and a third amplifying circuit; an input terminal of the first amplifying circuit being connected to an input terminal of the balancing circuit, an output terminal of the first amplifying circuit being connected to an output terminal of the balancing circuit;
   wherein an input terminal of the falling edge detection circuit is connected to the input terminal of the balancing circuit, an output terminal of the falling edge detection circuit being connected to an input terminal of the second amplifying circuit, an output terminal of the second amplifying circuit being connected to the output terminal of the balancing circuit;
   wherein an input terminal of the rising edge detection circuit is connected to the input terminal of the balancing circuit, an output terminal of the rising edge detection circuit being connected to an input terminal of the third amplifying circuit, an output terminal of the third amplifying circuit being connected to the output terminal of the balancing circuit.

2. The balancing circuit as claimed in claim 1, wherein the falling edge detection circuit includes a first time-delay unit, a first NOT gate, a second NOT gate, a first AND gate, a second time-delay unit, and a first path selection switch; the input terminal of the falling edge detection circuit is connected to an input terminal of the first time-delay unit, an output terminal of the first time-delay unit is connected to an input terminal of the first AND gate; the input terminal of the falling edge detection circuit is further connected to an input terminal of the first NOT gate, an output terminal of the first NOT gate is connected to another input terminal of the first AND gate, an output terminal of the first AND gate is connected to an input terminal of the second time-delay unit, an output terminal of the second time-delay unit is connected to an input terminal of the first path selection switch, the output terminal of the second time-delay unit is further connected to another input terminal of the first path selection switch through the second NOT gate, an output terminal of the first path selection switch serves as the output terminal of the falling edge detection circuit and is connected to the input terminal of the second amplifying circuit.

3. The balancing circuit as claimed in claim 1, wherein the rising edge detection circuit includes a first time-delay unit, a first NOT gate, a second NOT gate, a first AND gate, a first time-delay unit, and a first path selection switch; the input terminal of the rising edge detection circuit is connected to an input terminal of the first time-delay unit, an output terminal of the first time-delay unit is connected to an input terminal of the first NOT gate, an output terminal of the first NOT gate is connected to an input terminal of the first AND gate, the input terminal of the rising edge detection circuit is further connected to another input terminal of the first AND gate; an output terminal of the first AND gate is connected to an input terminal of the first time-delay unit, an output terminal of the first time-delay unit is connected to an input terminal of the first path selection switch, the output terminal of the first time-delay unit is further connected to another input terminal of the first path selection switch via the second NOT gate, an output terminal of the first path selection switch serves as the output terminal of the rising edge detection circuit and is connected to the input terminal of the third amplifying circuit.

4. The balancing circuit as claimed in claim 1, wherein the amplifying circuit includes an MOS (metal-oxide-silicon) transistor M1, an MOS transistor M2, an MOS transistor M3, an MOS transistor M4, an MOS transistor M5, an MOS transistor M6, a resistor R1, a resistor R2, a variable current source Itail0, a variable current source Itail1, and a variable current source Itail2; the MOS transistor M1, the MOS transistor M2, the resistor R1, the resistor R2 and the variable current source Itail0 constitute the first amplifying circuit; the MOS transistor M3, the MOS transistor M4, the resistor R1, the resistor R2 and the variable current source Itail1 constitute the second amplifier circuit; the MOS transistor M5, the MOS transistor M6, the resistor R1, the resistor R2 and the variable current source Itail2 constitute the third amplifier circuit;

a gate of the MOS transistor M1 is connected to an input terminal inp0 of the first amplifying circuit, a source of the MOS transistor M1 is grounded through the variable current source Itail0, a drain of the MOS transistor M1 is connected to a power supply Vdd through the resistor R1, and the drain of the MOS transistor M1 serves as one output terminal of the first amplifying circuit and is connected to an output terminal outn of the balancing circuit; a gate of the MOS transistor M2 is connected to an input terminal inn0 of the first amplifying circuit, a source of the MOS transistor M2 is grounded through the variable current source Itail0, a drain of the MOS transistor M2 is connected to the power supply Vdd through the resistor R2, and the drain of the MOS transistor M2 serves as another output terminal of the first amplifying circuit and is connected to another output terminal outp of the balancing circuit;

a gate of the MOS transistor M3 is connected to an input terminal inp1 of the second amplifying circuit, a source of the MOS transistor M3 is grounded through the variable current Itail1, a drain of the MOS transistor M3 is connected to the power supply Vdd through the resistor R1, and the drain of the MOS transistor M3 serves as one output terminal of the second amplifying circuit and is connected to the output terminal outn of the balancing circuit; a gate of the MOS transistor M4 is connected to an input terminal inn1 of the second amplifying circuit, a source of the MOS transistor M4 is grounded through the variable current source Itail1, a drain of the MOS transistor M4 is connected to the power supply Vdd through the resistor R2, and the drain of the MOS transistor M4 serves as another output terminal of the second amplifier circuit and is connected to the output terminal outp of the balancing circuit;

a gate of the MOS transistor M5 is connected to an input terminal inp2 of the third amplifying circuit, a source of the MOS transistor M5 is grounded through the variable current Itail2, a drain of the MOS transistor M5 is connected to the power supply Vdd through the resistor R1, and the drain of the MOS transistor M5 serves as one output terminal of the third amplifying circuit and is connected to the output terminal outn of the balancing circuit; a gate of the MOS transistor M6 is connected to an input terminal inn2 of the third amplifying circuit, a source of the MOS transistor M6 is grounded through the variable current Itail2, a drain of the MOS transistor M6 is connected to the power supply Vdd through the resistor R2, and the drain of the MOS transistor M6 serves as another output terminal of the third amplifying circuit and is connected to the output terminal outp of the balancing circuit.

5. The balancing circuit as claimed in claim 4, wherein the MOS transistor of the amplifying circuit is replaceable with a transistor.

* * * * *